United States Patent
Heo (10) Patent No.: US 8,674,740 B2
(45) Date of Patent: Mar. 18, 2014

(54) NOISE REMOVING DELAY CIRCUIT

(75) Inventor: Chang Jae Heo, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/532,645

(22) Filed: Jun. 25, 2012

(65) Prior Publication Data

US 2013/0033297 A1 Feb. 7, 2013

(30) Foreign Application Priority Data

Aug. 4, 2011 (KR) ........................ 10-2011-0077782

(51) Int. Cl.
*H03H 11/26* (2006.01)
(52) U.S. Cl.
USPC ........... 327/262; 327/284; 327/288; 327/290; 327/551
(58) Field of Classification Search
USPC ......... 327/261, 262, 276–278, 281, 283–285, 327/288, 290, 551–554
See application file for complete search history.

(56) References Cited

U.S. PATENT DOCUMENTS

| | | | |
|---|---|---|---|
| 5,479,132 A * | 12/1995 | Verhaeghe et al. | 327/553 |
| 7,180,326 B2 * | 2/2007 | Komyo | 326/27 |
| 7,397,292 B1 | 7/2008 | Potanin | |
| 2005/0122152 A1 | 6/2005 | Yoshida et al. | |

FOREIGN PATENT DOCUMENTS

| | | |
|---|---|---|
| EP | 0 687 065 A2 | 12/1995 |
| JP | 07-095022 | 4/1995 |
| JP | 07-336201 | 12/1995 |
| JP | 09-238073 | 9/1997 |
| JP | 11-145798 | 5/1999 |
| JP | 2000-059186 | 2/2000 |
| JP | 2002-368589 | 12/2002 |
| JP | 2007-096661 A | 4/2007 |
| JP | 2008-092271 A | 4/2008 |
| JP | 2009-278476 A | 11/2009 |
| JP | 2010-056677 | 3/2010 |
| KR | 10-2005-0056151 A | 6/2005 |
| WO | WO 2008/120473 A1 | 9/2008 |

* cited by examiner

*Primary Examiner* — William Hernandez
(74) *Attorney, Agent, or Firm* — Bracewell & Giuliani LLP (57) ABSTRACT

The present invention relates to a semiconductor circuit including: a delay unit for delaying an input signal by a predetermined time to output the delayed signal; a voltage adjusting unit for charging and discharging voltage according to a level of the input signal; and a combination unit for controlling the charging and discharging operations of the voltage adjusting unit according to signals generated using the level of the input signal and a level of the signal output from the delay unit, and it is possible to effectively remove low level noise and high level noise which are respectively mixed in a high level signal and a low level signal input to the semiconductor circuit.

6 Claims, 7 Drawing Sheets

NOISE REMOVING DELAY CIRCUIT

CROSS-REFERENCE TO RELATED APPLICATIONS

Claim and incorporate by reference domestic priority application and foreign priority application as follows:

CROSS REFERENCE TO RELATED APPLICATION

This application claims the benefit under 35 U.S.C. Section 119 of Korean Patent Application Serial No. 10-2011-0077782, entitled filed Aug. 4, 2011, which is hereby incorporated by reference in its entirety into this application.

BACKGROUND OF THE INVENTION

1. Field of the Invention

The present invention relates to a semiconductor circuit mounted in electronic devices, and more particularly, to a semiconductor circuit capable of removing noise mixed in an input signal.

2. Description of the Related Art

Generally, in electronic devices, noise occurs in a power line or a signal line, and there is a problem of malfunction of a semiconductor circuit mounted in the electronic device due to influence of noise.

For example, when the malfunction of the semiconductor circuit occurs due to noise applied to a reset terminal of the semiconductor circuit, a serious problem may occur in the electronic device since an internal circuit may be initialized.

Further, when noise is mixed in a signal input to the semiconductor circuit, it may be a main cause of interfering with a normal operation of the electronic device and the malfunction of the electronic device since the noise may be determined as the input signal.

Therefore, in order to overcome this problem, a semiconductor circuit, which can remove noise, has been proposed. However, in a conventional semiconductor circuit, when a plurality of noises are continuously superimposed on an input signal, there was a problem that it was difficult to accurately remove the corresponding noise.

RELATED PRIOR ART DOCUMENT

Japanese Patent Laid-open Publication No. 1995-095022

SUMMARY OF THE INVENTION

The present invention has been invented in order to overcome the above-described problems and it is, therefore, an object of the present invention to provide a semiconductor circuit capable of more effectively removing low level noise mixed in a high level input signal and high level noise mixed in a low level input signal.

In accordance with one aspect of the present invention to achieve the object, there is provided a semiconductor circuit including: a delay unit for delaying an input signal by a predetermined time to output the delayed signal; a voltage adjusting unit for charging and discharge voltage according to a level of the input signal; and a combination unit for controlling the charging and discharging operations of the voltage adjusting unit according to signals generated using the level of the input signal and a level of the signal output from the delay unit.

Here, the delay unit may include a plurality of inverters which invert the level of the input signal to output the inverted signal.

Further, the delay unit may include first and second inverters connected in series, and the voltage adjusting unit may be connected between a connection point of the first and second inverters and a ground.

And the first inverter may include first and second switches which selectively perform a switching operation according to the level of the input signal.

At this time, the first and second switches may consist of PMOS and NMOS, respectively.

In addition, the first inverter may include first and second current sources which are connected to the first and second switches, respectively.

Further, the voltage adjusting unit may consist of a condenser which charges and discharges the voltage according to the switching operation of the first and second switches.

In addition, the first inverter may open the first switch and close the second switch when the input signal varies from low level to high level, and the voltage adjusting unit may discharge the voltage according to the closing operation of the second switch.

At this time, the second inverter may output a high level signal when the voltage discharged from the voltage adjusting unit is lower than a preset reference voltage and output a low level signal when the voltage discharged from the voltage adjusting unit is not lower than the preset reference voltage.

Meanwhile, the first inverter may close the first switch and open the second switch when the input signal varies from high level to low level, and the voltage adjusting unit may charge the voltage according to the closing operation of the first switch.

Here, the second inverter may output a low level signal when the voltage charged in the voltage adjusting unit is higher than the preset reference voltage and output a high level signal when the voltage charged in the voltage adjusting unit is not higher than the preset reference voltage.

In addition, the combination unit may include first and second operators which perform a logic operation by combining the input signal and the signal output from the delay unit; and third and fourth switches which perform a switching operation according to levels of signals generated by the first and second operators.

At this time, the first and second operators may consist of an OR gate and an AND gate, respectively.

Meanwhile, the delay unit may include first to sixth inverters sequentially connected in series, and the voltage adjusting unit may be connected between a connection point of the third and fourth inverters and the ground.

And the third inverter may include first and second switches which selectively perform a switching operation according to the level of the input signal; and first and second current sources which are connected to the first and second switches, respectively.

In addition, the combination unit may control the charging and discharging operations of the voltage adjusting unit according to signals generated by combining a signal input to the second inverter and a signal output from the fifth inverter.

Further, the combination unit may include first and second operators which perform a logic operation by combining the signal input to the second inverter and the signal output from the fifth inverter; and third and fourth switches which perform a switching operation according to levels of signals generated by the first and second operators.

Here, the first and second operators may consist of a NAND gate and a NOR gate, respectively.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Terms or words used in the present specification and claims should not be interpreted as being limited to typical or dictionary meanings, but should be interpreted as having meanings and concepts relevant to the technical spirit of the present invention based on the rule according to which an inventor can appropriately define the concept of the term to describe his/her own invention in the best manner.

Therefore, configurations shown in the embodiments and drawings of the present invention rather are examples of the most exemplary embodiment and do not represent all of the technical spirit of the invention. Thus, it will be understood that various equivalents and modifications that replace the configurations are possible when filing the present application.

Hereinafter, embodiments of the present invention will be described in detail with reference to the accompanying drawings.

Figure 1:
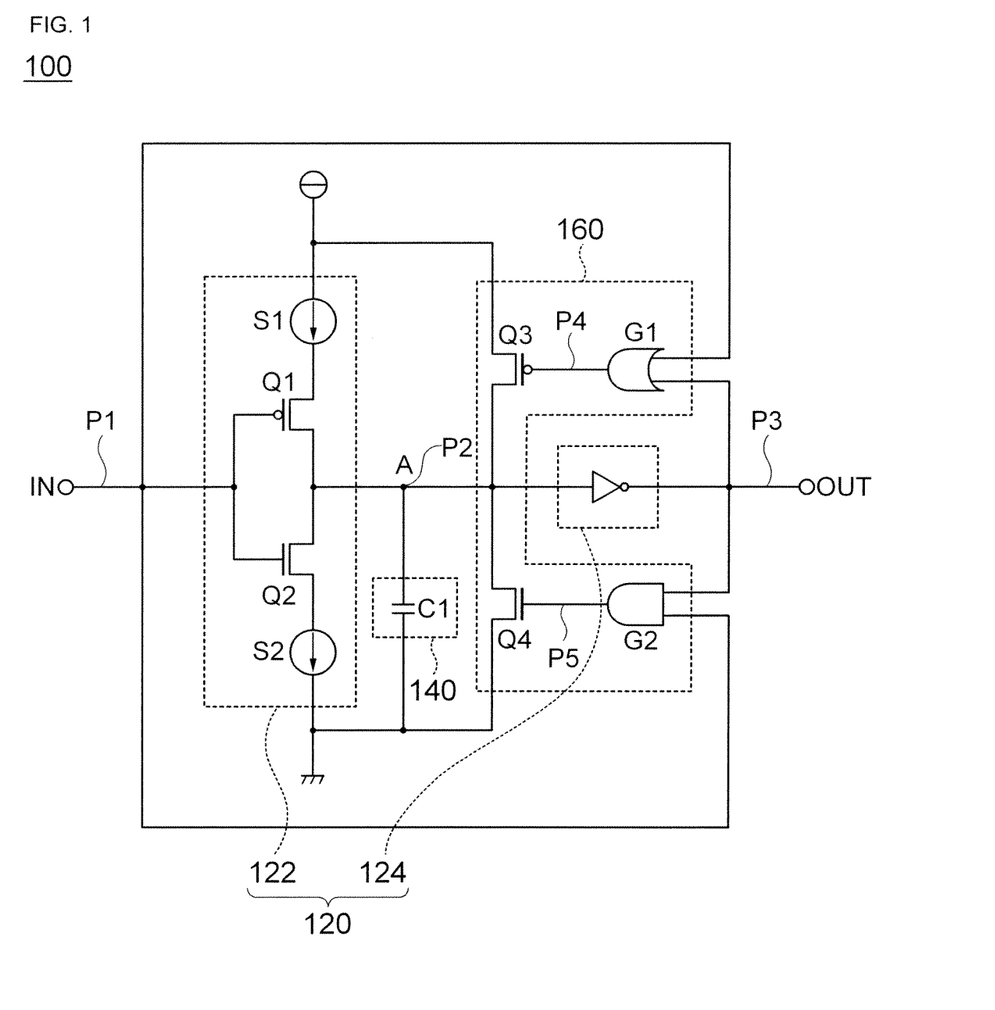
FIG. 1 is a configuration diagram of a semiconductor circuit in accordance with an embodiment of the present invention.
Figure 2:
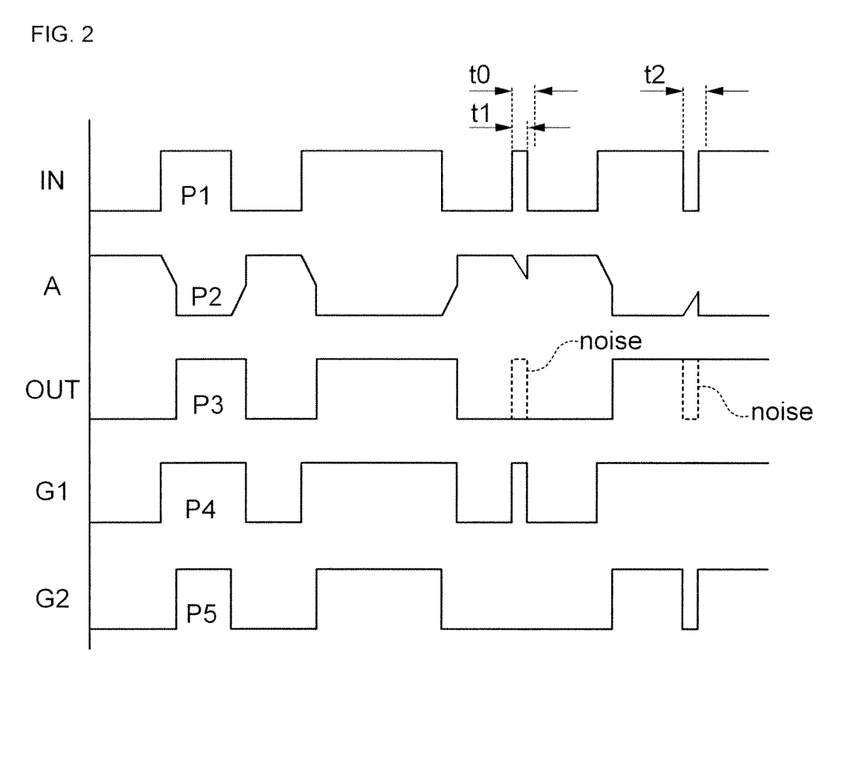
FIG. 2 is a timing diagram showing an operation of the semiconductor circuit for removing noise.

FIG. 1 is a configuration diagram of a semiconductor circuit in accordance with an embodiment of the present invention, and FIG. 2 is a timing diagram showing an operation of the semiconductor circuit for removing noise.

As shown in FIG. 1 and FIG. 2, a semiconductor circuit 100 includes a delay unit 120, a voltage adjusting unit 140, and a combination unit 160.

First, the delay unit 120, which is a means of delaying a signal P1 input to an input terminal IN of the semiconductor circuit 100 by a predetermined time to output the delayed signal, may consist of a plurality of (in detail, even number) inverters which invert a level of the input signal to output the inverted signal.

At this time, the delay unit 120 shown in FIG. 1 may consist of first and second inverters 122 and 124 connected in series, and the first inverter 122 may include first and second switches Q1 and Q2 which selectively perform a switching operation according to the level of the input signal P1 and first and second current sources S1 and S2 which are respectively connected to the first and second switches Q1 and Q2 to supply current to the first and second switches Q1 and Q2.

If the first inverter 122 is a CMOS inverter, it is preferred that the first and second switches Q1 and Q2 consist of PMOS and NMOS, respectively.

An operation of the first inverter 122 will be described in detail. When the input signal P1 varies from low level to high level, the first switch Q1. PMOS, is opened (OFF) and on the contrary, the second switch Q2. NMOS, is closed (ON) so that current flows to a ground through the second switch Q2 and the second current source 82.

If the input signal P1 varies from high level to low level, the first switch Q1. PMOS, is closed (ON) and on the contrary, the second switch Q2, NMOS, is opened (OFF) so that current output from the first current source S1 flows to the first switch Q1.

The voltage adjusting unit 140, which is a means of charging or discharging voltage according to the level of the input signal P1, may consist of a condenser C1 positioned between a connection point A of the first and second inverters 122 and 124 and the ground.

An operation of the above voltage adjusting unit 140 will be described in more detail. The voltage adjusting unit 140 charges or discharges voltage according to the switching operations of the first and second switches Q1 and Q2 of the first inverter 122. For example, as in FIG. 2, when the signal P1 input to the input terminal IN varies from low level to high level, the first switch Q1. PMOS, is opened (OFF) and on the contrary, the second switch Q2. NMOS, is closed (ON) so that the voltage charged in the condenser C1 is discharged through the second switch Q2 and the second current source S2.

Accordingly, the voltage charged in the condenser C1 is reduced with a predetermined slope, and the second inverter 124 outputs a high level signal P3 when the discharged voltage (voltage of a signal P2) is lower than a reference voltage of the second inverter 124.

On the other hand, the second inverter 124 outputs the low level signal P3 by determining that high level noise is mixed in the low level input signal P1 when the discharged voltage (voltage of the signal P2) is not lower than the reference voltage of the second inverter 124.

As above, a time until the input signal P1 varies from low level to high level and the output signal P3 is output becomes a noise filtering time t0 of removing the high level noise mixed in the low level input signal P1 as shown in FIG. 2, and a high level signal t1 with a pulse width shorter than the noise filtering time t0 is recognized as noise and removed.

Meanwhile, when the signal P1 input to the input terminal IN varies from high level to low level, the first switch Q1. PMOS, is closed (ON) and on the contrary, the second switch Q2. NMOS, is opened (OFF) so that the condenser C1 is charged through the first current source S1 and the first switch Q1.

Accordingly, the voltage charged in the condenser C1 is increased with a predetermined slope, and the second inverter 124 outputs the low level signal P3 when the charged voltage (voltage of the signal P2) is higher than the reference voltage of the second inverter 124.

On the other hand, the second inverter 124 outputs the high level signal P3 as it is by determining that low level noise is mixed in the high level input signal when the charged voltage (voltage of the signal P2) is not higher than the reference voltage of the second inverter 124.

As above, a time until the input signal P1 varies from high level to low level and the output signal P3 is output becomes a noise filtering time t2 (t2=t0) of removing the low level noise mixed in the high level input signal, and a low level signal with a pulse width shorter than the noise filtering time t2 is recognized as noise and removed.

The combination unit 160, which is a means of controlling charging and discharging operations of the voltage adjusting unit 140 according to signals generated using the level of the signal P1 input to the input terminal P1 and the level of the signal P3 output from an output terminal OUT, controls the charging and discharging operations of the voltage adjusting unit 140 according to signals P4 and P5 generated by combining the signal P1 input to the input terminal IN and the signal P3 output from the output terminal OUT and may consist of first and second operators G1 and G2 and third and fourth switches Q3 and Q4.

Here, the first and second operators G1 and G2 may consist of an OR gate and an AND gate, which perform logic (OR, AND) operations by combining the input signal P1 and the output signal P3, respectively.

The first operator G1, which consists of an OR gate, outputs the low level signal P4 only when the levels of the input signal P1 and the output signal P3 are all low and outputs the high level signal P4 in the remaining cases.

And the second operator G2, which consists of an AND gate, outputs the high level signal P5 only when the levels of the input signal P1 and the output signal P3 are all high and outputs the low level signal P5 in the remaining cases.

The third and four switches Q3 and Q4, which are means of performing a switching operation according to levels of the signals P4 and P5 output from the first and second operators G1 and G2, may consist of PMOS and NMOS, respectively.

An operation of the combination unit 160 will be described in more detail. The combination unit 160 prevents malfunction of the semiconductor circuit 100 due to superimposed application of noises on the input signal P1 in a state in which the condenser C1 of the voltage adjusting unit 140 is not completely charged or discharged.

Like this, when noises are continuously applied in a state in which the condenser C1 of the voltage adjusting unit 140 is not completely charged or discharged, although noise with a pulse width shorter than the noise filtering time t0 is applied, the second inverter 124 may output a normal signal as noise by mistake since the voltage charged in the condenser C1 is increased than the reference voltage.

An operation of the semiconductor circuit for removing noise will be described in detail with reference to FIG. 1 and FIG. 2.

When high level noise is mixed in a low level input signal input to the input terminal IN so that the input signal varies from low level to high level like P1, the first switch Q1, PMOS, is opened (OFF) and on the contrary, the second switch (22. NMOS, is closed (ON) so that the voltage charged in the condenser C1 is discharged through the second switch Q2 and the second current source 82.

Accordingly, the voltage charged in the condenser C1 is reduced with a predetermined slope. However, since the high level noise signal varies from high level to low level before the discharged voltage (voltage of the signal P2) reaches the reference voltage of the second inverter 124, the second switch Q2. NMOS, is opened (OFF) and on the contrary, the first switch Q1. PMOS, is closed (ON) so that the discharged voltage is charged in the condenser C1 through the first switch Q1 and the first current source S1 and the second inverter 124 maintains the low level signal P3.

Then, the first operator G1 performs an OR operation of the low level input signal P1 and the low level output signal P3 to output the low level signal P4, and the third switch Q3 is closed (ON) according to the low level signal P4 output from the first operator G1.

At the same time, the second operator G2 performs an AND operation of the high level noise signal P1 and the low level output signal P3 to output the low level signal P5, and the fourth switch Q4 is opened (OFF) according to the low level signal P5 output from the second operator G2.

Accordingly, since the discharged voltage is completely charged in the condenser C1 of the voltage adjusting unit 140 up to power voltage through the third switch Q3, it is possible to easily remove the high level noise superimposed on the low level input signal by constantly maintaining the noise filtering time to.

Meanwhile, when low level noise is included in a high level input signal input to the input terminal IN so that the input signal varies from high level to low level like P1, the first switch Q1, PMOS, is closed (ON) and on the contrary, the second switch Q2, NMOS, is opened (OFF) so that the condenser C1 is charged through the first current source S1 and the first switch Q1.

Accordingly, the voltage charged in the condenser C1 is increased with a predetermined slope. However, since the low level noise signal varies from low level to high level before the charged voltage (voltage of the signal P2) reaches the reference voltage of the second inverter 124, the first switch Q1. PMOS, is opened (OFF) and on the contrary, the second switch Q2. NMOS, is closed (ON) so that the voltage charged in the condenser C1 is discharged through the second switch Q2 and the second current source S2 and the second inverter 124 maintains the high level signal P3.

And the first operator G1 performs an OR operation of the low level input signal P1 and the high level output signal P3 to output the high level signal P4, and the third switch Q3 is opened (OFF) according to the high level signal P4 output from the first operator G1.

At the same time, the second operator G2 performs an AND operation of the high level noise signal P1 and the high level output signal P3 to output the high level signal P5, and the fourth switch Q4 is closed (ON) according to the high level signal P5 output from the second operator G2.

Then, since the voltage is completely discharged from the condenser C1 of the voltage adjusting unit 140 to ground voltage through the fourth switch Q4, it is possible to remove noise by constantly maintaining the noise filtering time t2 even though the low level noise is superimposed on the high level input signal.

Figure 3A:
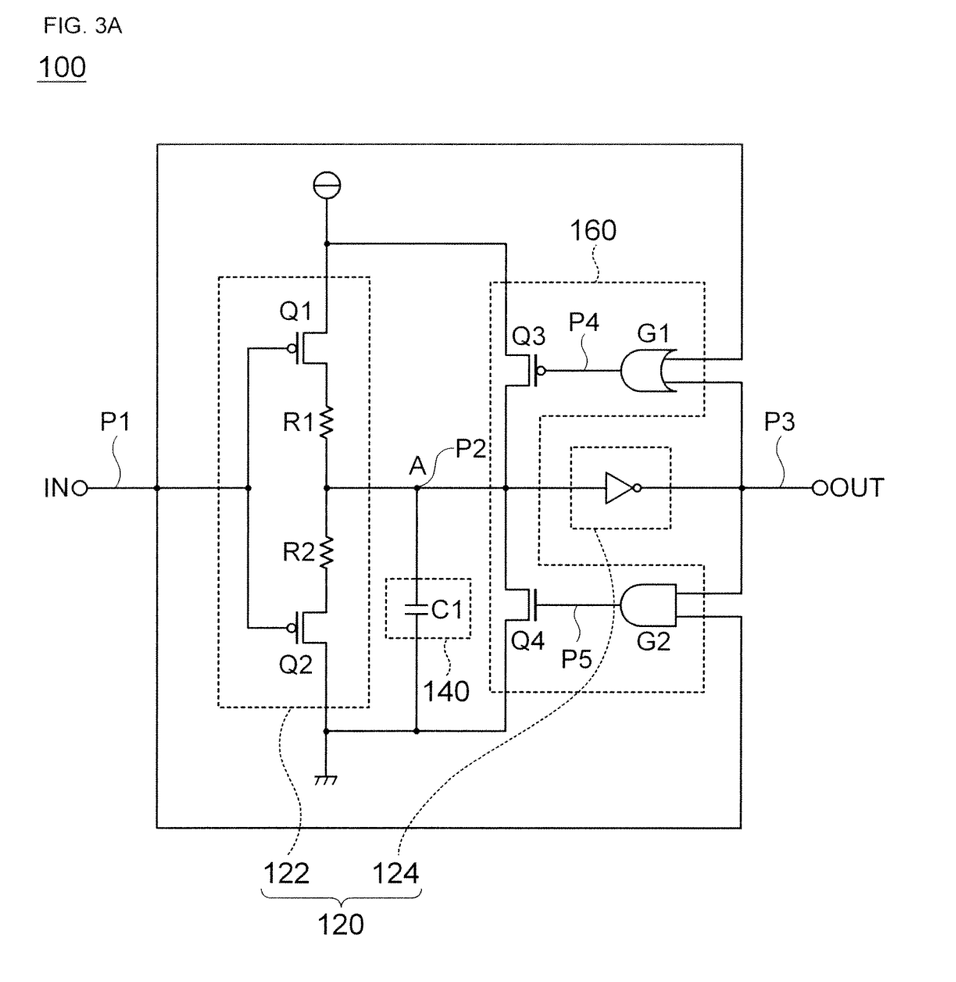
FIG. 3a is a configuration diagram of the semiconductor circuit in which first and second resistors are connected instead of first and second current sources of FIG. 1.
Figure 3B:
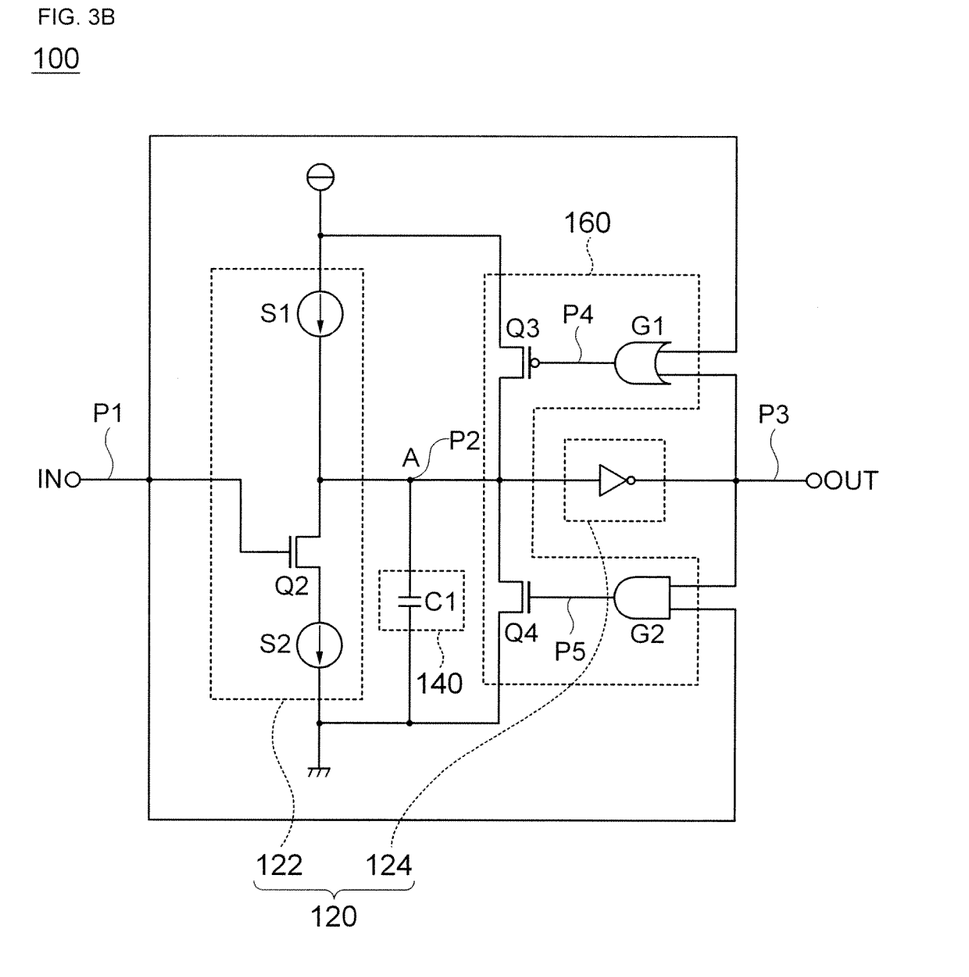
FIG. 3b is a configuration diagram of the semiconductor circuit from which a first switch of FIG. 1 is removed.
Figure 3C:
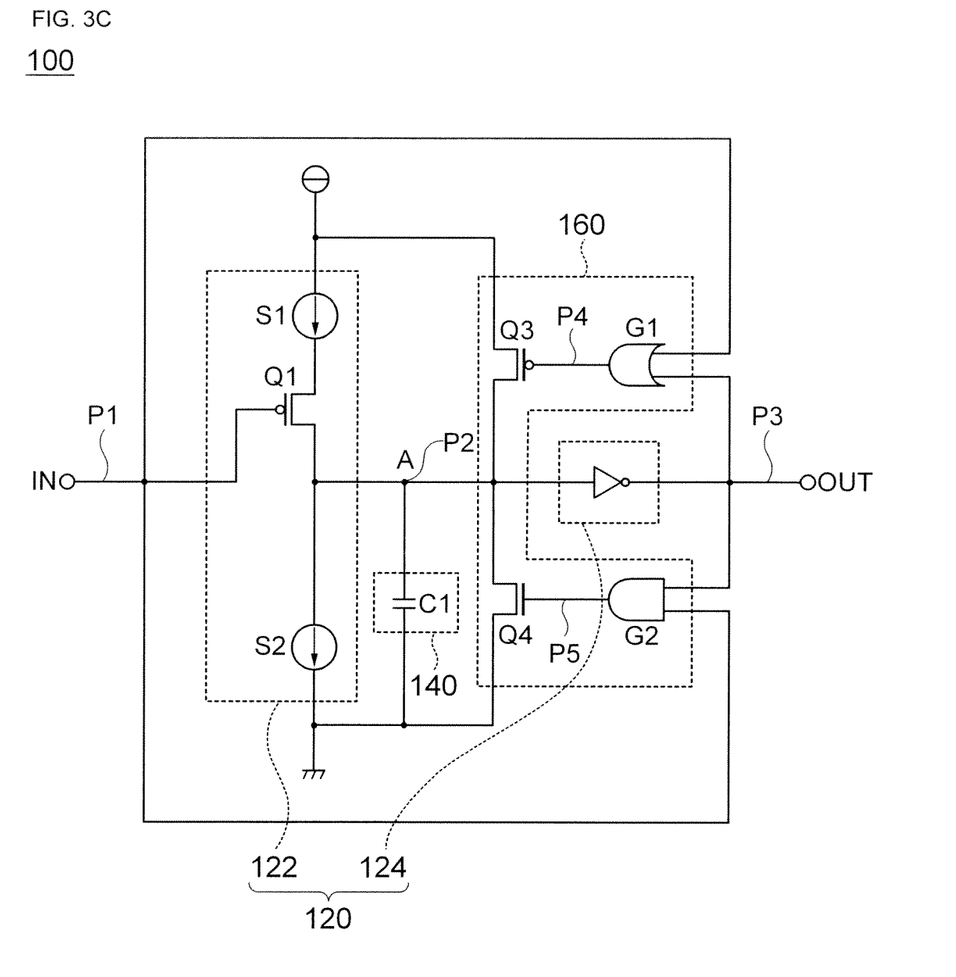
FIG. 3c is a configuration diagram of the semiconductor circuit from which a second switch of FIG. 1 is removed.

FIG. 3a is a configuration diagram of the semiconductor circuit in which first and second resistors are connected instead of first and second current sources of FIG. 1, FIG. 3b is a configuration diagram of the semiconductor circuit from which a first switch of FIG. 1 is removed, and FIG. 3c is a configuration diagram of the semiconductor circuit from which a second switch of FIG. 1 is removed.

As in FIG. 3a, the semiconductor circuit 100 in accordance with an embodiment of the present invention may use a method in which first and second resistors R1 and R2 are connected instead of the first and second current sources S1 and 82.

Further, as in FIG. 3b and FIG. 3c, it is possible to remove one of the first and second switches Q1 and Q2 of the first inverter 122.

Figure 4:
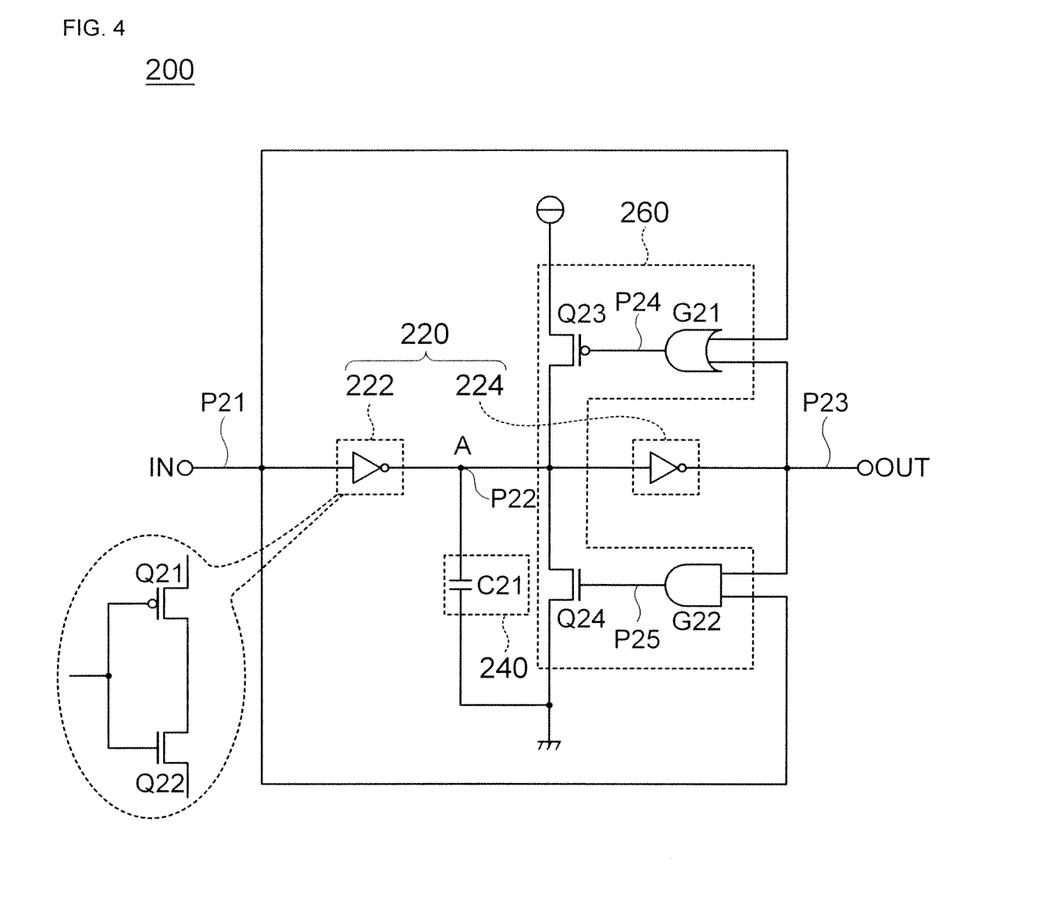
FIG. 4 is a configuration diagram of a semiconductor circuit in accordance with another embodiment of the present invention.

FIG. 4 is a configuration diagram of a semiconductor circuit in accordance with another embodiment of the present invention.

As shown in FIG. 4, a semiconductor circuit 200 includes a delay unit 220, a voltage adjusting unit 240, and a combination unit 260.

First, the delay unit 220 may consist of first and second inverters 222 and 224 connected in series, and the first inverter 222 may consist of first and second switches Q21 and Q22 except first and second current sources S1 and S2 shown in FIG. 1.

Further, the first inverter 222 may use various methods in addition to a method in which the first and second switch Q21 and Q22 are connected in series as shown in FIG. 4.

Hereinafter, since configurations of the voltage adjusting unit 240 and the combination unit 260 are already described in an embodiment of the present invention, descriptions thereof will be omitted.

An operation of the semiconductor circuit 200 of FIG. 4 will be described. When a signal P21 input to an input terminal IN varies from low level to high level, the first switch Q21. PMOS, is opened (OFF) and on the contrary, the second switch Q22. NMOS, is closed (ON) so that the voltage charged in a condenser C21 is discharged.

Accordingly, the voltage charged in the condenser C21 is reduced with a predetermined slope, and the second inverter 224 outputs a high level signal P23 when the discharged voltage (voltage of a signal P22) is lower than a reference voltage of the second inverter 224.

Then, a first operator G21 performs an OR operation of the high level input signal P21 and the high level output signal P23 to output a high level signal P24, and a third switch Q23 is opened (OFF) according to the high level signal P24 output from the first operator G21.

At the same time, a second operator G22 performs an AND operation of the high level input signal P21 and the high level output signal P23 to output a high level signal P25, and a fourth switch Q24 is closed (ON) according to the high level signal P25 output from the second operator G22.

Accordingly, since the voltage charged in the condenser C21 is completely discharged to a ground through the fourth switch Q24, it is possible to easily remove low level noise superimposed on the high level input signal by constantly maintaining a noise filtering time t2.

At this time, the noise filtering time t2 may be determined by sizes of the condenser C21 and the first switch Q21, and a size of the fourth switch Q24, which discharges the charged voltage of the condenser due to noise to have the constant noise filtering time, is determined to discharge the condenser without delay.

Meanwhile, when the signal P21 input to the input terminal IN varies from high level to low level, the first switch Q21. PMOS, is closed (ON) and on the contrary, the second switch Q22, NMOS, is opened (OFF) so that the condenser C21 is charged.

Accordingly, the voltage charged in the condenser C21 is increased with a predetermined slope, and when the charged voltage (voltage of the signal P22) is higher than the reference voltage of the second inverter 224, the second inverter 224 outputs the low level signal P23.

And the first operator G21 performs an OR operation of the low level input signal P21 and the low level output signal P23 to output the low level signal P24, and the third switch Q23 is closed (ON) according to the low level signal P24 output from the first operator G21.

At the same time, the second operator G22 performs an AND operation of the low level input signal P21 and the low level output signal P23 to output the low level signal P25, and the fourth switch Q24 is opened (OFF) according to the low level signal P25 output from the second operator G22.

Then, since the voltage is completely charged in the condenser C21 of the voltage adjusting unit 240 up to power voltage through the third switch Q3, it is possible to remove noise by constantly maintaining a noise filtering time t0 even though high level noise is superimposed on the low level input signal.

At this time, the noise filtering time t0 may be determined by sizes of the condenser C21 and the second switch Q22, and a size of the third switch Q23, which charges the discharged voltage of the condenser due to noise to have the constant noise filtering time, is determined to charge the condenser without delay.

Figure 5:
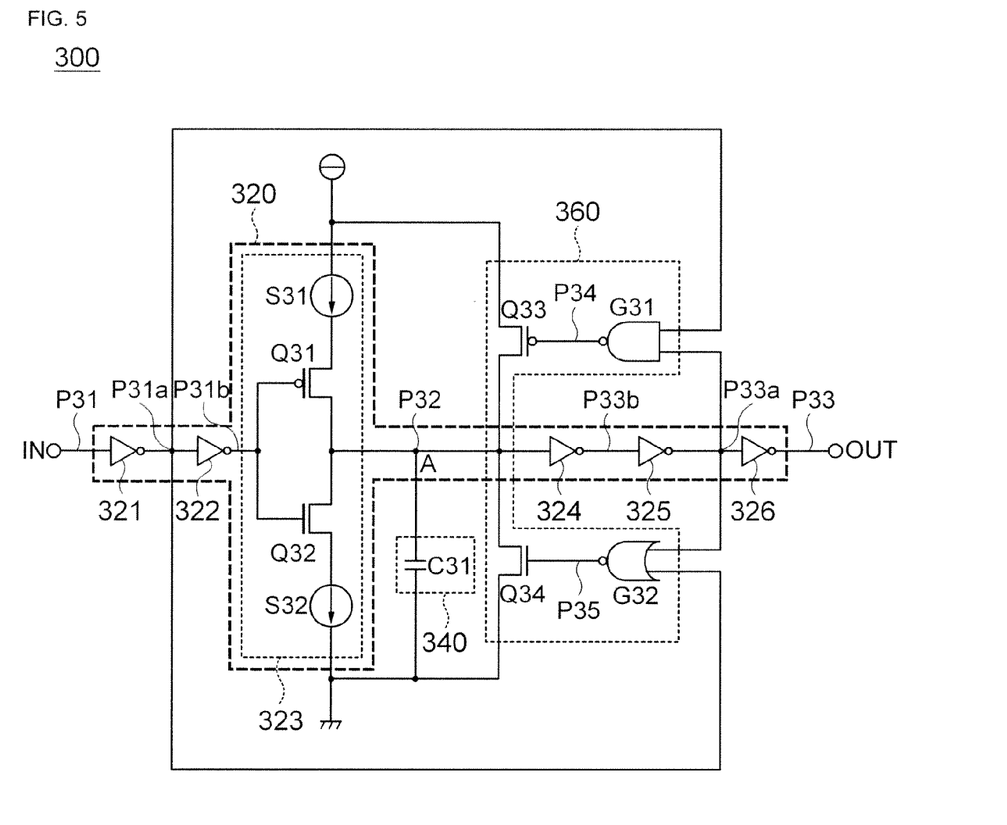
FIG. 5 is a configuration diagram of a semiconductor circuit in accordance with still another embodiment of the present invention.

FIG. 5 is a configuration diagram of a semiconductor circuit in accordance with still another embodiment of the present invention.

As shown in FIG. 5, a semiconductor circuit 300 includes a delay unit 320, a voltage adjusting unit 340, and a combination unit 360.

First, the delay unit 320 may consist of first to sixth inverters 321 to 326 connected in series, and the third inverter 323 may include first and second switches Q31 and Q32 which selectively perform a switching operation according to a level of an input signal P31 and first and second current sources S31 and S32 which are respectively connected to the first and second switches Q31 and Q32 to supply current to the first and second switches Q31 and Q32.

Further, the voltage adjusting unit 340 may include a condenser C31 connected between a connection point A of the third and fourth inverter 323 and 324 and a ground.

And the combination unit 360, which is a means of controlling charging and discharging operations of the voltage adjusting unit 340 according to signals generated using a level of a signal input to an input terminal IN and a level of a signal output from an output terminal OUT, more particularly, controls the operation of the voltage adjusting unit 340 according to signals P34 and P35 generated by combining a signal P31a output from the first inverter 321 and a signal P33a output from the fifth inverter 325 and may consist of first and second operators G31 and G32 and third and fourth switches Q33 and Q34.

Here, the first and second operators G31 and G32 may consist of a NAND gate and a NOR gate, respectively.

The first operator G31, which consists of a NAND gate, outputs the low level signal P34 only when levels of the signal P31a output from the first inverter 321 and the signal P33a output from the fifth inverter 325 are all high and outputs the high level signal P34 in the remaining cases.

And the second operator G32, which consists of a NOR gate, outputs the high level signal P35 only when the levels of the signal P31a output from the first inverter 321 and the signal P33a output from the fifth inverter 325 are all low and outputs the low level signal P35 in the remaining cases.

Hereinafter, since a configuration of the voltage adjusting unit 340 is already described in an embodiment of the present invention, a description thereof will be omitted.

An operation of the semiconductor circuit 300 of FIG. 5 will be described. When the signal P31 input to the input terminal IN varies from low level to high level, the first inverter 321 outputs the low level signal P31a, and the second inverter 322 outputs a high level signal P31b. Accordingly, the first switch Q31, PMOS, is opened (OFF) and on the contrary, the second switch Q32, NMOS, is closed (ON) so that the voltage charged in the condenser C31 is discharged through the second switch Q32 and the second current source S32.

Accordingly, the voltage charged in the condenser C31 is reduced with a predetermined slope, and when the discharged voltage (voltage of a signal P32) is lower than a reference voltage of the fourth inverter 324, the fourth inverter 324 outputs a high level signal P33b and the fifth inverter 325 outputs the low level signal P33a.

Then, the first operator G31 performs a NAND operation of the low level input signal P31a output from the first inverter 321 and the low level output signal P33a output from the fifth inverter 325 to output the high level signal P34, and the third switch Q33 is opened (OFF) according to the high level signal P34 output from the first operator G31.

At the same time, the second operator G32 performs a NOR operation of the low level input signal P31a output from the first inverter 321 and the low level output signal P33a output from the fifth inverter 325 to output the high level signal P35, and the fourth switch Q34 is closed (ON) according to the high level signal P35 output from the second operator G32.

Accordingly, since the voltage charged in the condenser C31 of the voltage adjusting unit 340 is completely discharged to the ground through the fourth switch Q34, it is possible to easily remove low level noise superimposed on the high level input signal P31 by constantly maintaining a noise filtering time t2.

Meanwhile, when the input P31 input to the input terminal IN varies from high level to low level, the first inverter 321 outputs the high level signal P31a and the second inverter 322 outputs the low level signal P31b. Accordingly, the first switch Q31, PMOS, is closed (ON) and on the contrary, the second switch Q32, NMOS, is opened (OFF) so that the condenser C31 is charged.

Accordingly, the voltage charged in the condenser C31 is increased with a predetermined slope, and when the charged voltage (voltage of the signal P32) is higher than the reference voltage of the fourth inverter 324, the fourth inverter 324 outputs the low level signal P33b and the fifth inverter 325 outputs the high level signal P33a.

And the first operator G31 performs a NAND operation of the high level input signal P31a output from the first inverter 321 and the high level output signal P33a output from the fifth operator 325 to output the low level signal P34, and the third operator Q33 is closed (ON) according to the low level signal P34 output from the first operator G31.

At the same time, the second operator G32 performs a NOR operation of the high level input signal P31a output from the first inverter 321 and the high level output signal P33a output from the fifth inverter 325 to output the low level signal P35, and the fourth switch Q34 is opened (OFF) according to the low level signal P35 output from the second operator G32.

Then, since the voltage is completely charged in the condenser C31 of the voltage adjusting unit 340 up to power voltage through the third switch Q33, it is possible to remove noise by constantly maintaining a noise filtering time t0 even though high level noise is superimposed on the low level input signal P31.

Meanwhile, in an embodiment and another embodiment of the present invention, although it is described that the delay unit consists of two or six inverters, it is possible to implement the delay unit by using a various number of inverters without being limited thereto.

As described above, according to a semiconductor circuit in accordance with an embodiment of the present invention, it is possible to more effectively remove low level noise mixed in a high level input signal and high level noise mixed in a low level input signal.

Further, it is possible to easily remove noise without malfunction of the semiconductor circuit even when the noises are continuously applied.

And since it is possible to implement an input signal delaying function as well as a noise removing function, it is possible to reduce a chip size of the semiconductor circuit.

Due to this, there are effects that manufacturing cost of the semiconductor circuit and manufacturing cost of an electronic device in which the semiconductor circuit is mounted can be reduced.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A semiconductor circuit comprising:
    a delay unit for delaying an input signal by a predetermined time to output a delayed signal, wherein the delay unit comprises first to sixth inverters sequentially connected in series which invert a level of the input signal;
    a voltage adjusting unit connected between a connection point of the third and fourth inverters and ground for charging and discharging a voltage according to the level of the input signal; and
    a combination unit for controlling the charging and discharging operations of the voltage adjusting unit according to signals generated using the level of the input signal and a level of the delayed signal output from the delay unit.

2. The semiconductor circuit according to claim 1, wherein the third inverter comprises:
    first and second switches which selectively perform a switching operation according to the level of the input signal; and
    first and second current sources which are connected to the first and second switches, respectively.

3. The semiconductor circuit according to claim 1, wherein the third inverter comprises:
    first and second switches which selectively perform a switching operation according to the level of the input signal; and
    first and second resistors which are connected to the first and second switches, respectively.

4. The semiconductor circuit according to claim 1, wherein the combination unit controls the charging and discharging operations of the voltage adjusting unit according to signals generated by combining a signal input to the second inverter and a signal output from the fifth inverter.

5. The semiconductor circuit according to claim 4, wherein the combination unit comprises:
    first and second operators which perform a logic operation by combining the signal input to the second inverter and the signal output from the fifth inverter; and
    third and fourth switches which perform a switching operation according to levels of signals generated by the first and second operators.

6. The semiconductor circuit according to claim 5, wherein the first and second operators consist of a NAND gate and a NOR gate, respectively.

* * * * *